United States Patent
Yagi et al.

(10) Patent No.: US 6,297,442 B1
(45) Date of Patent: Oct. 2, 2001

(54) SOLAR CELL, SELF-POWER-SUPPLY DISPLAY DEVICE USING SAME, AND PROCESS FOR PRODUCING SOLAR CELL

(75) Inventors: Shigeru Yagi; Seiji Suzuki; Nobuyuki Torigoe, all of Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/413,805

(22) Filed: Oct. 7, 1999

(30) Foreign Application Priority Data

Nov. 13, 1998 (JP) .................................................. 10-323895
Jul. 26, 1999 (JP) .................................................. 11-210727

(51) Int. Cl.[7] .................................................. H01L 31/04
(52) U.S. Cl. .................. 136/256; 136/258; 136/262; 136/252; 136/265; 257/53; 257/103; 257/615; 257/447; 257/448; 257/460; 257/461; 257/431; 438/85; 438/93; 438/96; 438/97; 438/98
(58) Field of Search .............................. 136/256, 258 PC, 136/258 AM, 262, 252, 265; 257/53, 103, 615, 447, 448, 460, 461, 431; 438/85, 93, 96, 97, 98

(56) References Cited

U.S. PATENT DOCUMENTS

| | | | |
|---|---|---|---|
| 4,663,495 | * 5/1987 | Berman et al. | 136/248 |
| 4,695,674 | * 9/1987 | Bar-on | 136/256 |
| 5,078,804 | * 1/1992 | Chen et al. | 136/260 |
| 5,288,700 | * 2/1994 | McDowell | 429/111 |
| 5,652,434 | * 7/1997 | Nakamura et al. | 257/13 |
| 5,986,285 | * 11/1999 | Yagi | 257/53 |
| 6,180,871 | * 1/2001 | Campbell et al. | 136/258 |

FOREIGN PATENT DOCUMENTS

| | | |
|---|---|---|
| 8-56007 | 2/1996 | (JP) . |
| 10-256577 | * 9/1998 | (JP) . |

OTHER PUBLICATIONS

Mancini et al., Thin Solid Films, 124, pp. 85–92, 1985 (month unknown).*

K. Murata et al. "Features and application of amorphous Si solar cells—See–through and flexible modules", Applied Physics, vol. 67, No. 10, 1998, pp. 1192–1198 (month unknown).

* cited by examiner

*Primary Examiner*—Alan Diamond
(74) *Attorney, Agent, or Firm*—Oliff & Berridge, PLC

(57) ABSTRACT

It is to provide an essentially transparent solar cell of high efficiency that can be used by accumulating with a display device to generate electricity simultaneously with utilization of the display function, a self-power-supply display device comprising the same, and a process for producing the solar cell. The solar cell comprises at least a transparent conductive substrate having thereon a photoconductor layer that is transparent to a visible ray and has an absorbance of 0.8 or less at a wavelength of from 400 to 800 nm, and a transparent conductive electrode in this order. An embodiment, in which the photoconductor layer contains at least one element selected from Group IIIA elements and at least one element selected from Group VA elements in the Periodic Table, and an embodiment, in which the photoconductor layer contains a metallic oxide semiconductor, are preferred. Furthermore, an embodiment, in which the metallic oxide semiconductor is titanium oxide or zinc oxide, and an embodiment, in which the photoconductor layer has an optical gap of 2.8 eV or more, are preferred.

14 Claims, 3 Drawing Sheets

SOLAR CELL, SELF-POWER-SUPPLY DISPLAY DEVICE USING SAME, AND PROCESS FOR PRODUCING SOLAR CELL

FIELD OF THE INVENTION

The present invention relates to a transparent solar cell comprising a transparent conductive substrate having thereon a novel photoconductor layer, a self-power-supply display device using the same, and a process for producing the solar cell.

BACKGROUND OF THE INVENTION

In recent years, clean energy has been demanded for protecting the global environment, such as prevention of harmful influence of $CO_2$. A solar cell is one of the most expected energy sources because it can utilize the solar energy, which is substantially inexhaustible. A crystalline or amorphous silicon solar cell and a high-efficiency solar cell using a Group III-V compound semiconductor, such as GaAs and InP, have been subjected to practical use. In order to increase the proportion of clean energy in the whole-consumed energy, the consuming electric power should be substituted with a solar cell as much as possible. In order to spread a solar cell to various practical applications, it is important to widen the applicable field, as well as making the device itself to have a high efficiency. From such a point of view, what is receiving attention as an applicable field of a solar cell is, in addition to generation of electricity of relatively large-scale power such as electric power for home, to supply electric power from a solar cell to an apparatus used out of doors, such as a portable electronic apparatus and a portable personal computer.

However, since a large proportion of the surface of such an apparatus is occupied by a display device and an input device, there is no space for mounting a solar cell to the apparatus, and since a solar cell has a certain color, it is difficult to mount a solar cell to the apparatus from the standpoint of design. It is considered to utilize windows occupying a large proportion of an automobile and a building, as a space for mounting a solar cell. However, a solar cell currently available has a certain color and is not transparent since it utilizes a visible ray, and therefore lighting cannot be ensured. Furthermore, it is also considered to utilize other parts than the display device or the windows, but such is currently difficult from the standpoint of design.

The problems can be solved by a transparent solar cell. In other words, the problems can be solved when a high efficiency solar cell for ultraviolet rays can be formed on a transparent substrate.

Investigations of a solar cell have been made to improve the efficiency in a short wavelength region for increasing the sensitivity. However, it has been known that when, for example, the proportion of C in an amorphous $Si_{1-x}C_x$ film is increased, the photoconductivity characteristics are rapidly deteriorated. That is, there is no material suitable as a photovoltaic material of a wide optical gap having a sensitivity in a short wavelength region, and there is no transparent solar cell of a high efficiency and a wide area.

On the other hand, a see-through type solar cell, through which the opposite side can be seen, is proposed, a large proportion of which is one having many minute holes therein. It is as if the opposite side is seen through a sieve, and cannot be applied to a display device, which is minute and should exhibit a sufficient brightness with a low electric power, or a window of an automobile, which requires both lighting and safety.

In recent years, a nitride series compound semiconductor receives attention as a semiconductor material of a wide optical gap. However, because such a semiconductor represented by GaN is produced through crystal growth at a temperature of from 800 to 1,000° C., and sapphire is frequently used as a substrate, it is difficult to apply to a solar cell from the standpoint of cost and size.

SUMMARY OF THE INVENTION

The invention has been developed to solve the problems described above and to attain the following objects.

An object of the invention is to provide a solar cell that can generate electricity with utilizing effectively harmful and useless ultraviolet rays, that can be used by accumulating with a display device to generate electricity simultaneously with utilization of the display function, and that is essentially transparent and exhibits less feeling of existence.

Another object of the invention is to provide a self-power-supply display device using the solar cell.

A further object of the invention is to provide a process for producing the solar cell.

In order to attain the objects described above, the invention relates to the following embodiments.

(1) A solar cell comprising a transparent conductive substrate having thereon a photoconductor layer that is transparent to a visible ray and has an absorbance of 0.8 or less at a wavelength of from 400 to 800 nm, and a transparent conductive electrode in this order.

(2) A solar cell as described in item (1), wherein the photoconductor layer contains at least one element selected from Group IIIA elements and at least one element selected from Group VA elements in the Periodic Table.

(3) A solar cell as described in item (1), wherein the photoconductor layer contains a metallic oxide semiconductor.

(4) A solar cell as described in item (3), wherein the metallic oxide semiconductor contains at least one of titanium oxide and zinc oxide.

(5) A solar cell as described in items (1), wherein the photoconductor layer has a laminated structure.

(6) A solar cell as described in item (5), wherein the laminated structure comprises a first photoconductor layer containing at least one element selected from Group IIIA elements and at least one element selected from Group VA elements in the Periodic Table, and a second photoconductor layer containing a metallic oxide semiconductor.

(7) A solar cell as described in items (1), wherein the photoconductor layer has an optical gap of 2.8 eV or more.

(8) A solar cell as described in items (1), wherein the solar cell has a photoelectric conversion efficiency for light of an ultraviolet region that is larger than a photoelectric conversion efficiency for light of a visible region.

(9) A self-power-supply display device comprising a solar cell as described in items (1), and a display device accumulated thereon.

(10) A process for producing a solar cell comprising a step of providing a photoconductor layer on a transparent conductive substrate by activating a compound containing a nitrogen element to an activated species (for example, a necessary energy condition or an excited species), and reacting the activated species with an organic metallic compound containing at least one element selected from Al, Ga and In; and a step of providing a transparent conductive electrode on the photoconductor layer.

(11) A process for producing a solar cell as described in items (10), wherein said reacting under an atmosphere containing hydrogen.

DETAILED DESCRIPTION OF THE INVENTION

Figure 1:
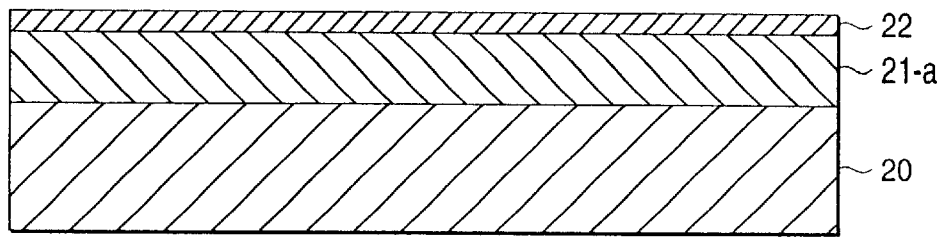
FIG. 1 is a schematic cross sectional view showing a solar cell according to the first embodiment of the invention.

The invention will be described in detail below.

The solar cell of the invention comprises at least a transparent conductive substrate having thereon a photoconductor layer and a transparent conductive electrode in this order.

Photoconductor Layer

The photoconductor layer has an absorbance of 0.8 or less in a wavelength of from 400 to 800 nm and is transparent to a visible ray. When the absorbance at a wavelength of from 400 to 800 nm is more than 0.8, the photoconductor layer strongly absorbs a visible ray, and is colored to be opaque. The absorbance at a wavelength of from 400 to 800 nm is preferably 0.6 or less, and more preferably 0.4 or less.

Since the photoconductor layer of the invention generally has a larger absorbance toward the shorter wavelength side, a smaller absorbance is exhibited on a longer wavelength side than 400 nm, and the photoconductor layer becomes substantially transparent. Taking the inclination of absorbance into consideration, it is preferred that the absorbance at 400 nm is 0.8 or less, and the absorbance at 500 nm is 0.5 or less.

In order to make the photoconductor layer to have an absorbance at a wavelength of from 400 to 800 nm of 0.8 or less, the photoconductor layer preferably contains a Group III-V compound semiconductor, and further it preferably contains other components, such as hydrogen and a p-type or n-type element, depending on necessity. The Group III-V compound semiconductor comprises at least one element selected from Group IIIA elements and at least one element selected from Group VA elements in the Periodic Table.

Group III-V Compound Semiconductor

Group IIIA Element

Preferred examples of the Group IIIA elements include Al, Ga and In. An organic metallic compound containing the element is preferably used in the production process in the invention. For example, a liquid or solid material, such as trimethylaluminum, triethylaluminum, t-butylaluminum, trimethylgallium, triethylgallium, t-butylgallium, trimethylindium, triethylindium and t-butylindium, may be evaporated and used as it is, or it may be used as a mixed gas obtained by bubbling into a carrier gas. These may be used singly or combination of two or more thereof.

Examples of the carrier gas include a rare gas, such as He and Ar, a simple substance gas, such as $H_2$ and $N_2$, a hydrocarbon, such as methane and ethane, and a halogenated carbon, such as $CF_4$ and $C_2F_6$.

Group VA Element

A preferred example of the VA element includes nitrogen. As a raw material of nitrogen, a gas, such as $N_2$, $NH_3$, $NF_3$, $N_2H_4$, monomethylhydrazine and dimethylhydrazine, and a mixed gas obtained by bubbling the gas into a carrier gas.

Examples of the carrier gas include those exemplified above.

The proportion of the number of atoms of the Group IIIA element and the Group VA element is preferably from 0.5/1.0 to 1.0/0.5. When the proportion is outside the range, a part having a Zincblende structure is reduced in the bond of the Group IIIA element and the Group VA element to increase defects, and the resulting product may not function as a good solar cell.

Other Components

Hydrogen

The photoconductor layer preferably contains hydrogen. The concentration of hydrogen is preferably 50% by atom or less.

When the concentration of hydrogen in the layer (hereinafter sometimes called as "film") exceeds 50% by atom, the electric characteristics are deteriorated and at the same time, the mechanical characteristics, such as hardness, are also lowered, and furthermore, the film is liable to be oxidized to deteriorate weather resistance.

The hydrogen concentration can be measured as an absolute value by a hydrogen forward scattering (HFS) method. Furthermore, when the film is formed on a substrate transparent to infrared rays, such as silicon and sapphire, simultaneously with the production thereof, the condition of hydrogen contained in the film can be easily measured by the infrared absorption spectrum.

p-Type or n-Type Controlling Elements

The photoconductor layer may be doped with a p-type or n-type controlling element by introducing a compound containing the element therein. A doping gas may be introduced as mixed with the organic metallic compound containing the Group IIIA element or may be introduced separately therefrom. The doping gas may be introduced simultaneously with the organic metallic compound or may be introduced continuously thereto.

Examples of the n-type element include Li of Group IA (Group 1 in Inorganic Chemical Nomenclature of 1989 by IUPAC); Cu, Ag and Au of Group IB (Group 11 in Inorganic Chemical Nomenclature of 1989 by IUPAC); Mg of Group IIA (Group 2 in Inorganic Chemical Nomenclature of 1989 by IUPAC); Zn of Group IIB (Group 12 in Inorganic Chemical Nomenclature of 1989 by IUPAC); C, Si, Ge, Sn and Pb of Group IVA (Group 14 in Inorganic Chemical Nomenclature of 1989 by IUPAC); and S, Se and Te of Group VIA (Group 16 in Inorganic Chemical Nomenclature of 1989 by IUPAC). Among these, C, Si, Ge and Sn are preferred from the standpoint of the controllability of the charge carrier.

Examples of the p-type element include Li, Na and K of Group IA; Cu, Ag and Au of Group IB; Be, Mg, Ca, Sr, Ba and Ra of Group IIA; Zn, Cd and Hg of Group IIB; C, Si, Ge, Sn and Pb of Group IVA; S, Se and Te of Group VIA (Group 16 in Inorganic Chemical Nomenclature of 1989 by IUPAC); Cr, Mo and W of Group VIB (Group 6 in Inorganic Chemical Nomenclature of 1989 by IUPAC); and Fe (Group 8 in Inorganic Chemical Nomenclature of 1989 by IUPAC), Co (Group 9 in Inorganic Chemical Nomenclature of 1989 by IUPAC) and Ni (Group 10 in Inorganic Chemical Nomenclature of 1989 by IUPAC) of Group VIII. Among these, Be, Mg, Ca, Zn and Sr are preferred from the standpoint of the controllability of the charge carrier.

As the i-type element, those element exemplified for the p-type may be used at a low concentration.

It is necessary that the dopant is prevented from inactivation due to bonding to hydrogen contained in the film, and thus hydrogen for passivation of the defect level should be selectively bonded to the Group IIIA element and the Group VA element but not to the dopant. From that standpoint, C, Si, Ge and Sn are particularly preferred as the n-type element; Be, Mg, Ca, Zn and Sr are particularly preferred as the p-type element; and Be, Mg, Ca, Zn and Sr are particularly preferred as the i-type element.

Upon doping, for an element of an n-type, $SiH_4$, $Si_2H_6$, $GeH_4$, $GeF_4$ and $SnH_4$ may be used; for an element of a p-type, $BeH_2$, $BeCl_2$, $BeCl_4$, cyclopentadienyl magnesium, dimethylcalcium, dimethylstrontium, dimethylzinc and diethylzinc may be used; and for an element of an i-type, the same compound for the p-type may be used in the form of gas. The doping element may be diffused into the film in the form of element per se, and may be caught in the form of ion by the film.

The thickness of the photoconductor layer containing the Group III-V compound semiconductor may be appropriately selected depending on the object, and is not particularly limited. Furthermore, the thickness is different between the case where the photoconductor layer containing the Group III-V compound semiconductor has the single-layer structure and the case where the photoconductor layer has the laminated structure, such as a pin structure. In general, the thickness of the photoconductor layer having the single-layer structure is from 0.01 to 5 $\mu$m, and in the case having the laminated structure, the thickness of the respective layer constituting the laminated structure is thinner than the single-layer structure although it depends on the number of layers laminated.

Metallic Oxide Semiconductor

It is also preferred in the invention that the photoconductor layer contains a metallic oxide semiconductor instead of the Groups III to V compound semiconductor for making the photoconductor layer to have an absorbance of 0.8 at less in a wavelength of from 400 to 800 nm.

Preferred examples of the metallic oxide semiconductor include a photoconductor of a wide optical gap, such as titanium oxide and zinc oxide. These may be used singly or in combination of two or more of them.

Titanium oxide may be in the form of either crystals or microcrystals, or ever polycrystals. The form of the crystals maybe either a rutile structure or an anatase structure. Zinc oxide may also be in the form of either crystals or microcrystals, or ever polycrystals.

These metallic oxide semiconductors have a smooth surface and are transparent. Titanium oxide and zinc oxide are n-type semiconductors owing to an oxygen bond defect formed by deviation of the oxygen concentration from the stoichiometric proportion, and form a Schottky barrier with the transparent conductive electrode. The proportion of oxygen and titanium may be from 1:0.3 to 1:0.7, and the proportion of oxygen and zinc may be from 1:0.9 to 1:1.2. After forming the photoconductor layer, the conductivity thereof can be controlled by conducting, for example, a hydrogen plasma treatment or a heat annealing treatment in a hydrogen atmosphere.

The thickness of the photoconductor layer containing the metallic oxide semiconductor may be appropriately selected depending on the object, and is not particularly limited. In general, the thickness of the photoconductor layer is from 0.01 to 10 $\mu$m.

Laminated Structure

The solar cell of the invention is produced by forming the first photoconductor layer containing the Groups III to V compound semiconductor and/or the second photoconductor layer containing the metallic oxide semiconductor, on a transparent substrate which is conductive or has been subjected to a conductive treatment. At this time, a Schottky type solar cell can be produced by forming a photoconductor layer having a single-layer structure, and its efficiency can be increased by forming the laminated structure, such as a pn diode structure and a pin structure, in the first photoconductor layer. In order to make the solar cell transparent, light of a short wavelength, such as a violet ray or ultraviolet rays, is utilized, and therefore the amount of the light is not large. Accordingly, in order to effectively utilize the light, a film having a different optical gap may be laminated.

The solar cell of the invention preferably has the laminated structure comprising the first photoconductor layer containing at least one element selected from Group IIIA elements and at least one element selected from Group VA elements in the Periodic Table, and the second photoconductor layer containing a metallic oxide semiconductor, from the standpoint of a photovoltaic force, cost and easiness of forming a solar cell of a large area.

FIG. 1 is a schematic cross sectional view of a solar cell according to the first embodiment of the invention. The solar cell comprises a transparent conductive substrate 20 having thereon a first photoconductor layer (Group III-V compound semiconductor) 21-*a* and a transparent electrode 22, and the photoconductor layer has a single layer structure in this order.

Figure 2:
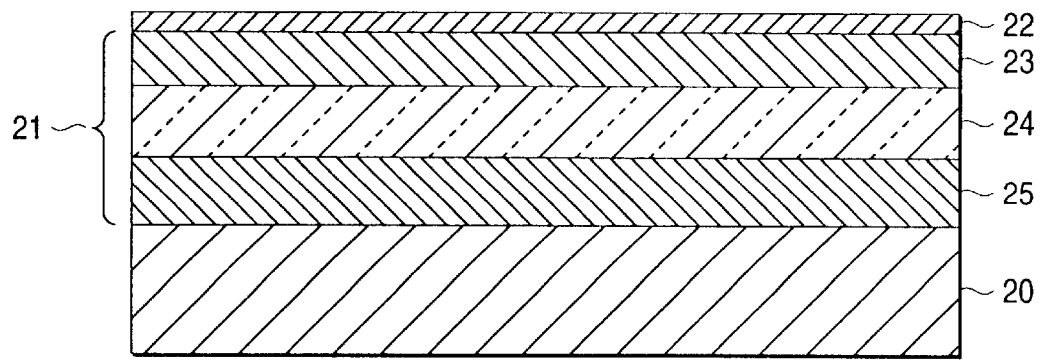
FIG. 2 is a schematic cross sectional view showing a solar cell according to the second embodiment of the invention.

FIG. 2 is a schematic cross sectional view of a solar cell according to the second embodiment of the invention. While the solar cell of this embodiment also comprises a transparent conductive substrate 20 having thereon a first photoconductor layer 21 and a transparent electrode 22 in this order, the photoconductor layer 21 has a laminated structure. That is, the photoconductor layer 21 comprises a laminated structure comprising, from the side of the transparent substrate 20, an n-type photoconductor layer 25, an i-type photoconductor layer 24 and a p-type photoconductor layer 23 laminated in this order.

In the case where the photoconductor layer has a laminated structure, the photoconductor layer may comprise, from the side of the transparent conductive substrate, a p-type photoconductor layer, an i-type photoconductor layer and an n-type photoconductor layer laminated in this order.

Figure 3:
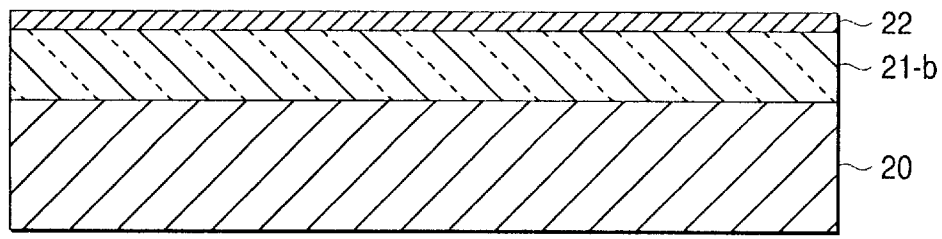
FIG. 3 is a schematic cross sectional view showing a solar cell according to the third embodiment of the invention.

FIG. 3 is a schematic cross sectional view of a solar cell according to the third embodiment of the invention. The solar cell comprises a transparent conductive substrate 20 having thereon a second photoconductor layer (metallic oxide compound semiconductor) 21-*b* and a transparent electrode 22 in this order, and the photoconductor layer has a single-layer structure.

Figure 4:
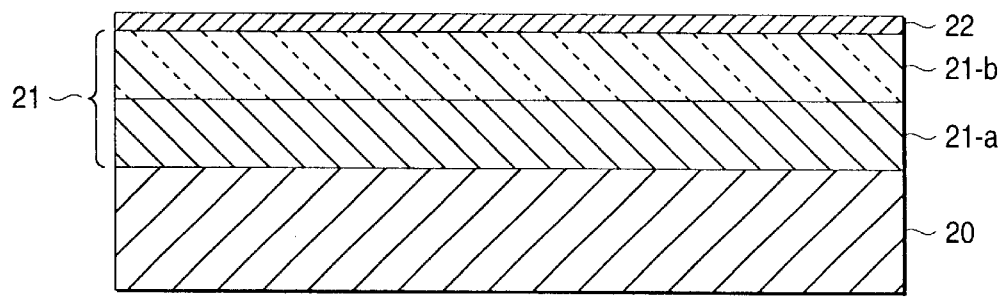
FIG. 4 is a schematic cross sectional view showing a solar cell according to the fourth embodiment of the invention.

FIG. 4 is a schematic cross sectional view of a solar cell according to the fourth embodiment of the invention. The solar cell comprises a transparent conductive substrate 20 having thereon a first photoconductor layer (Group III-V compound semiconductor) 21-*a*, a second photoconductor layer (metallic oxide compound semiconductor) 21-*b* and a transparent electrode 22 in this order, and the photoconductor layer 21 has a laminated structure.

Figure 5:
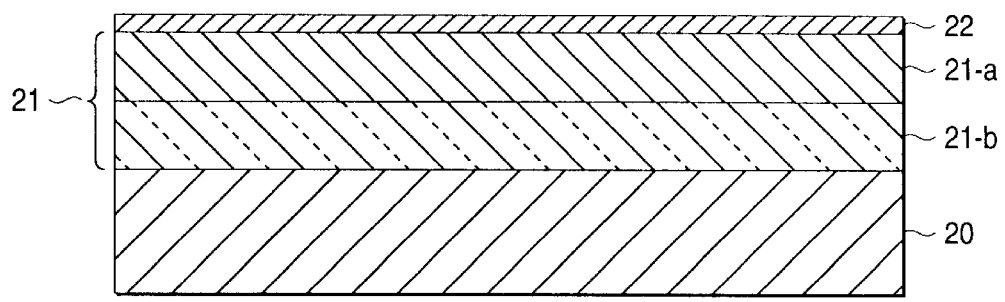
FIG. 5 is a schematic cross sectional view showing a solar cell according to the fifth embodiment of the invention.

FIG. 5 is a schematic cross sectional view of a solar cell according to the fourth embodiment of the invention. The solar cell comprises a transparent conductive substrate 20 having thereon a second photoconductor layer (metallic oxide compound semiconductor) 21-*b*, a first photoconductor layer (Groups III to V compound semiconductor) 21-*a* and a transparent electrode 22 in this order, and the photoconductor layer 21 has a laminated structure.

The composition and the thickness of the photoconductor layer having a different optical gap containing at least one element selected from Al, Ga and In, with nitrogen and hydrogen may be controlled by changing the concentrations or the flow rates of the raw material gas and the carrier gas, or by changing the discharge energy. It is preferred that the thickness is controlled by the film forming time.

The photoconductor layer containing the Groups III to V compound semiconductor may comprise an n-type or p-type photoconductor containing at least one element selected from Al, Ga and In, with nitrogen and hydrogen. Furthermore, a $p^+$-layer or an $n^+$-layer, which are doped at a high concentration, may be inserted, and a $p^-$-layer or an $n^-$-layer, which are doped at a low concentration, may also be inserted.

In order to ensure the transparency and to form a barrier, the p-type layer, the i-type layer and the n-type layer may have compositions of Al, Ga, In and N represented by $Al_xGa_yIn_z$, (x: 0 to 1.0, y: 0 to 1.0, z: 0 to 1.0), which are different from each other, and each of the p-type layer, the i-type layer and the n-type layer may have plural compositions of $Al_xGa_yIn_zN:H$ (x: 0 to 1.0, y: 0 to 1.0, z: 0 to 1.0).

Optical Gap

In order to transmit the main part of the visible ray, so as to make the photoconductor layer transparent that is substantially colorless or slightly colored, the optical gap of the photoconductor layer is preferably 2.8 eV or more.

The optical gap of the film can be arbitrarily changed by the mixing ratio of the Group IIIA elements. Taking GaN:H as the standard, when it is made more than 3.5 eV, it can be increased until about 6.5 eV by adding Al, and when it is made less than 3.2 eV, the measuring wavelength range can be changed with maintaining transparency by adding In.

The optical gap can be obtained by extrapolating the linear part in the low energy part in the plot between the wavelength (eV) and the square of the extinction coefficient ($\alpha e$). Alternatively, it may be the wavelength (eV) at the extinction coefficient of 10,000 $cm^{-1}$. The extinction coefficient is obtained by using the absorbance eliminating the background or by measuring the dependency on the film thickness.

The photoconductor layer containing the Groups III to V compound semiconductor or the metallic oxide semiconductor exhibit no ring-form diffraction pattern in the transmission electron beam diffraction pattern, but exhibits a blurred halo pattern with completely missing the long distance order; exhibits the halo pattern containing a ring-form diffraction pattern; further exhibits a luminous dot therein; or exhibits only a luminous dot. In the X-ray diffractiometry of such a layer, in which the measurement is conducted in a wider range than the transmission electron beam diffraction, it is often the case where substantially no peak is obtained.

There is also the case where a number of luminous dots are observed along with the ring-form diffraction pattern in the transmission electron beam diffraction pattern; or the case where although the most of the pattern comprises spot-form luminous dots, the layer comprises polycrystals, or the peak intensity is smaller than the single crystal, but weak peaks ascribable to the orientation of other planes. Alternatively, the layer may exhibits an X-ray diffraction pattern comprising only luminous dots ascribable to the orientation of the substantially single plane.

The size of the crystal of the Groups III to V compound semiconductor is from 5 nm to 5 µm, and the size of the crystal of the metallic oxide semiconductor is from 5 nm to 50 µm, which can be measured, for example, by X-ray diffraction, electron beam diffraction, or shape measurement using an electron micrograph of the cross section.

The absorbance of the photoconductive member is preferably 0.8 or less at 400 nm and 0.5 or less at 500 nm to realize colorless transparency or lightly colored transparency. The extinction coefficient is a natural logarithm of a value obtained by dividing the absorbance measured by a spectrophotometer by the film thickness, and the light transmission at 400 nm is preferably 50,000 $cm^{-1}$ or less, and more preferably 30,000 $cm^{-1}$ or less, in order that the layer is considered to be transparent. These values correspond to an optical gap of 2.8 eV or less.

Transparent Conductive Substrate

The substrate used in the invention is transparent and has electric conductivity. When the material constituting the substrate has conductivity or semiconductivity, it can be used without subjecting to a conductive treatment, and when the material has an insulating property, it can be used as the substrate by subjecting the insulating material to a conductive treatment. The substrate used in the invention may be a crystalline material or an amorphous material.

Examples of the transparent material constituting the transparent conductive substrate include a transparent material, such as a transparent inorganic material, e.g., glass, quartz, sapphire, MgO, SiC, ZnO, $TiO_2$, LiF and $CaF_2$; a film or a plate of a transparent organic resin, e.g., a fluoroplastics, polyester, polycarbonate, polyethylene, polyethylene terephthalate and an epoxy resin; an optical fiber; and Selfoc optical plate.

In the case where the transparent material has an insulating property, a conductive treatment is conducted by subjecting film formation using a transparent conductive material, such as ITO, zinc oxide, tin oxide, lead oxide, indium oxide and copper iodide, by a method such as vapor deposition, ion plating or sputtering, or, alternatively, by subjecting film formation using a metal, such as aluminum, stainless steel, nickel and chromium, or gold, silver, copper or an alloy thereof, by a vapor deposition method, a sputtering method or an ion plating method to such a thickness that the film becomes translucent. A part thus having been subjected to the conductive treatment functions as a transparent electrode.

Transparent Conductive Electrode

Examples of the transparent conductive electrode formed on the photoconductor layer include those formed by using a transparent conductive material, such as ITO, zinc oxide, tin oxide, lead oxide, indium oxide and copper iodide, by a method, such as vapor deposition, ion plating or sputtering, and those formed by using a metal, such as aluminum, nickel, chromium, gold, silver and copper, or an alloy thereof, by a method, such as vapor deposition or sputtering, to such a small thickness that the film becomes translucent Process for Producing Solar Cell The process for producing a solar cell according to the invention will be described with reference to the drawing.

Figure 6:
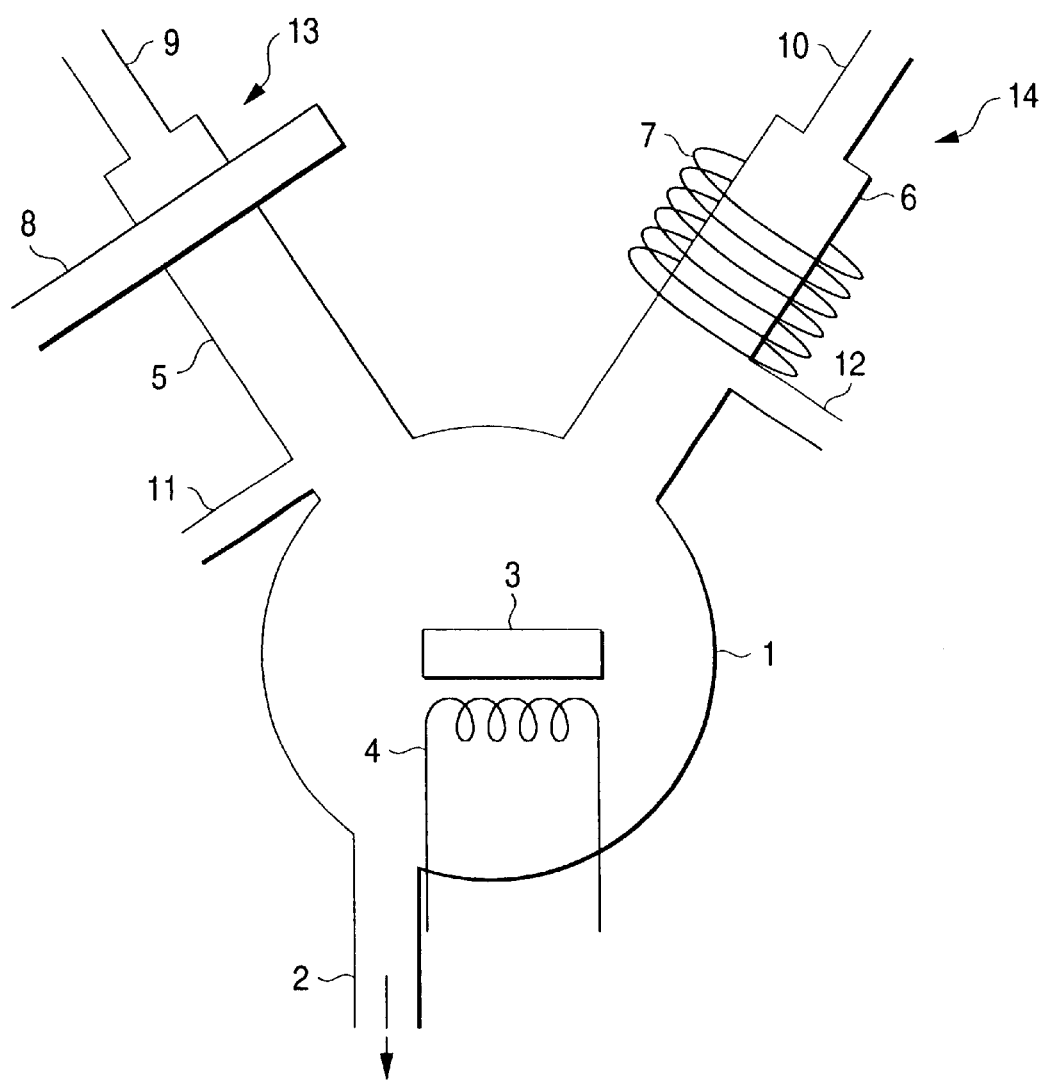
FIG. 6 is a schematic diagrammatic view showing one embodiment of an apparatus for producing a solar cell of the invention.

FIG. 6 is a schematic diagrammatic view showing one embodiment of an apparatus for producing a solar cell according to the invention. The photoconductor layer containing the Groups III to V compound semiconductor can be suitably produced by using the production apparatus. The apparatus for producing a solar cell comprises a cylindrical reactor 1; first and second raw material activators/suppliers 13 and 14 continued to the reactor 1 through upper openings;

an exhaust tube 2 for exhausting a gas contained in the reactor 1, continued to the reactor 1 through a lower opening; a substrate holder 3 for supporting the substrate and equipped in the reactor 1; and a heater 4 equipped on the substrate holder on the side opposite to the substrate.

The first and second raw material activators/suppliers 13 and 14 each comprise a cylindrical quartz tube 5 or 6 continued to the reactor 1 and arranged outside the reactor 1 in the radial direction, and a gas inlet tube 9 or 10 continued to the quartz tube 5 or 6 on the side opposite to the reactor 1.

The first raw material activator/supplier 13 further comprises a microwave waveguide 8 arranged to cross the quartz tube 5, and a gas inlet tube 11 continued to the quartz tube 5 at a position on the side of the reactor 1 with respect to the crossing position of the quartz tube 5 and the microwave waveguide 8. The microwave waveguide 8 is in a form of a box, and the quartz tube 5 penetrates therein.

The second raw material activator/supplier 14 comprises a high frequency coil 7 instead of the microwave waveguide 8, and the high frequency coil 7 is wound on the outer periphery of the quartz tube 6 and connected to a high frequency oscillator not shown in the figure.

The gas inlet tubes 9, 10, 11 and 12 of the first and second raw material activators/suppliers 13 and 14 are connected to a bomb (not shown) as raw material supplying means.

A mass flow controller (not shown) is equipped on the gas inlet tubes 11 and 12 for supplying a raw material gas intermittently. The microwave waveguide 8 is connected to a microwave oscillator using a magnetron (not shown), and forms discharge in the quartz tube 5. Furthermore, the exhaust tube 2 is connected to a pump (not shown) as exhausting means, by which the reactor 1 can be evacuated to substantial vacuum.

In the apparatus, $N_2$, for example, is used as a nitrogen source, which is introduced into the quartz tube 5 through the gas inlet tube 9. A microwave is supplied to the microwave waveguide 8 connected to the microwave oscillator using a magnetron (not shown), and discharge is formed inside the quartz tube 5. $H_2$, for example, is introduced into the quartz tube 6 from the another gas inlet tube 10. A high frequency is supplied to the high frequency coil 7 from the high frequency oscillator (not shown), and discharge is formed inside the quartz tube 6. Trimethylgallium, for example, is supplied from the gas inlet tube 12 on the downstream side of the discharge space, so as to form a film of a gallium nitride photoconductor on the transparent conductive substrate.

The substrate temperature is about from 100 to 600° C. In the case where the substrate temperature is high and/or the flow rate of the raw material gas of the Group IIIA element is small, the film is liable to be microcrystals. In the case where the substrate temperature is lower than 300° C., the film is liable to be microcrystals when the flow rate of the raw material gas of the Group IIIA element is small. In the case where the substrate temperature is higher than 300° C., the film is liable to be microcrystals even when the flow rate of the raw material gas of the Group IIIA element is larger than that under the low temperature condition. In the case where $H_2$ discharge is conducted, the microcrystallization proceeds more than in the case where $H_2$ discharge is not conducted. An organic metallic compound containing indium or aluminum may be used instead of trimethylgallium, or they may be mixed therewith.

The organic metallic compound may be separately supplied to the gas inlet tube 11.

An amorphous, microcrystalline or crystalline photoconductor layer having an arbitrary conductive type, such as an n-type or a p-type, can be obtained by introducing a gas containing at least one element selected from C, Si, Ge and Sn, or a gas containing at least one element selected from Be, Mg, Ca, Zn and Sr, from the downstream side of the discharge space (i.e., the gas inlet tube 11 or the gas inlet tube 12).

In the apparatus, activated nitrogen and activated hydrogen formed by the discharge energy may be independently controlled, or a gas simultaneously containing a nitrogen atom and a hydrogen atom, such as $NH_3$, may be used. Furthermore, conditions, where active hydrogen is released from the organic metallic compound, may also be employed. By using such a measure, an activated atom of the Group IIIA element and an activated nitrogen atom are present on the transparent conductive substrate in a controlled state, and because the hydrogen atom inactivates a methyl group and an ethyl group to make an inactive molecule, such as methane and ethane, carbon is not introduced even at a low temperature, and thus an amorphous film, a microcrystalline film or a crystalline film, in which defects are suppressed, can be obtained.

The activating method in the raw material activator/supplier may be any of direct current discharge, low frequency discharge, high frequency discharge, microwave discharge, an electron cyclotron resonance method or a helicon plasma method, and a method using a heating filament may also be employed. These method may be used singly or in combination of two or more of them. In the case of the high frequency discharge, either an induction coupling type or a capacitive type may be employed.

In the case where two or more activation methods are applied in a single space, they should be adjusted such that discharges are simultaneously conducted at the same pressure, or a difference in pressure may be provided between the interior of the microwave waveguide (or the high frequency waveguide) and the interior of the quartz tube (or the reactor). In the case where the pressures of them are identical to each other, the excitation energy of the active species can be largely changed by using different raw material activation means, such as microwave discharge and high frequency discharge, and thus the film quality can be controlled.

In the invention, the film formation may be conducted in an atmosphere, in which at least hydrogen is activated, such as ion plating and reactive sputtering.

The process for producing the photoconductor layer containing the metallic oxide semiconductor will be described.

The photoconductor layer containing the metallic oxide semiconductor can be produced by vapor deposition, reactive vapor deposition, ion plating, sputtering, reactive sputtering, a CVD method using a reaction between a metallic chlorine compound or an organic compound and oxygen, or hydrolysis or thermal decomposition of a metallic alkoxide compound or a metallic chelate compound.

Examples of the alkoxide compound include tetramethoxytitanium, tetraethoxytitanium, tetrapropoxytitanium, zinc methylate and zinc ethylate. Examples of the metallic chelate compound include acetylacetonatozinc and acetylacetonatotitanium, as an acetylacetone compound.

In vapor deposition, reactive vapor deposition, ion plating, sputtering and reactive sputtering, titanium oxide and zinc oxide may be used as a raw material, and the film formation may be conducted by using titanium oxide or zinc oxide as a raw material in an atmosphere containing oxygen. A method may be employed, in which titanium and oxygen as raw materials are directly reacted.

Furthermore, a method may be employed, in which an oxide film is obtained by using a gas, such as titanium chloride, titanium alkoxide, zinc chloride or zinc alkoxide, which are decomposed and reacted under a heated state in an oxygen atmosphere or in an oxygen plasma. In the case or the reaction in an oxygen plasma, the production apparatus shown in FIG. 6 may be employed.

The substrate temperature under the production conditions is from 100 to 600° C. In the case where the substrate temperature is high, the particle size of the microcrystals is liable to be large.

In the solar cell of the invention, an electric current can be taken out from the transparent conductive electrode. Because the solar cell of the invention having the constitution described above is completely transparent and has a large optical gap, a voltage that can be taken out is as large as two to three times that of the conventional solar cell, and as a result, a usable amount of electricity per unit area is large. The solar cell is excellent in light resistance, heat resistance and oxidation resistance, and has an advantage of a long service life.

Self-power-supply Display Device

Because the solar cell of the invention is transparent, a self-power-supply display device can be fabricated by directly combining with a display device. For example, the solar cell can supply a driving power for an apparatus used out of doors, such as a portable electronic apparatus and a portable personal computer.

The solar cell of the invention has an advantage in that it can be used by accumulating with a display device and does not impair the function of the display device. A secondary battery can be charged when the display is irradiated with light even if the display device is used or is not used. When the photoconductor layer having a small optical gap is formed to make the transmitted light amount 10% or less, the display of the display device can be colored, and the electromotive electric current can be increased.

As the display device, those using a liquid crystal, a cathode ray tube, a field emission element or a plasma may be used. By accumulating the transparent solar cell of the invention on the display device, the solar cell not only can supply a photovoltaic force, but also can prevent deterioration of the display device using a liquid crystal comprising an organic substance that is liable to be decomposed by ultraviolet rays because the solar cell mainly absorbs light in the ultraviolet region to generate photovoltaic force, and thus the ultraviolet rays cannot reach the display device. Accordingly, a member having a function of preventing deterioration due to ultraviolet rays, such as an ultraviolet ray prevention film, can be omitted from the display device. Furthermore, when the solar cell of the invention is used in a window of a building and a windshield of an automobile, a harmful ultraviolet ray can be shielded, and at the same time, an electricity can be generated. The whole of electric power may be supplied from the solar cell, or a part of electric power may be supplied to prolong the continuous use time of the battery or to make the battery to be small size and light weight.

The invention will be described in more detail with reference to examples below, but the invention is not construed as being limited thereto.

EXAMPLE 1

A transparent conductive substrate comprising Corning 7059 glass having on the surface thereof ITO formed by a sputtering method was placed on the substrate holder 3, and after evacuating the interior of the reactor 1 to vacuum through the exhaust tube 2, the substrate was heated to 300° C. by the heater 4. An $N_2$ gas was introduced into the quartz tube 5 having a diameter of 25 mm at a rate of 1,000 sccm through the gas inlet tube 9 of the first raw material activator/supplier 13, and discharge was conducted with the microwave waveguide 8 by setting the microwave output of 2.45 GHz to 250 W, which was matched with a tuner. At this time, the reflected wave was 0 W. An $H_2$ gas was introduced into the quartz tube 6 having a diameter of 30 mm at a rate of 1,000 sccm through the gas inlet tube 10 of the second raw material activator/supplier 14, and high frequency discharge of 13.56 MHz was conducted. The output power of the high frequency electric power was 100 W, and the reflected wave was 0 W.

Under these conditions, 1 sccm of a vapor of trimethylgallium (TMGa) maintained at 0° C. was introduced through a mass flow controller from the gas inlet tube 11 of the first raw material activator/supplier 13 by using hydrogen as a carrier gas with bubbling. A cycle, in which trimethylgallium (TMGa) was introduced for 10 seconds and then terminated for 10 seconds, was repeated. Cyclopentadienyl magnesium was then introduced with hydrogen as a carrier gas in 1 sccm. The reaction pressure measured by a Baratron vacuum gage was 0.5 Torr. The film formation was conducted for 60 minutes to produce an i-type GaN:H film having a thickness of 0.2 $\mu$m. Accordingly, a photoconductor layer containing the Group III-V compound semiconductor was formed.

An $SnO_2$ film was produced thereon by a sputtering method to provide a transparent conductive electrode.

The composition of the film formed under the same conditions as the GaN film was measured by Ratherford backscattering (RBS) spectroscopy, and it was found that the Ga/N ratio was about 0.9, which was substantially the stoichiometric ratio. The hydrogen content measured by the HFS measurement was 5% by atom or less.

The electron beam diffraction spectrum was of a spot pattern, and the X-ray diffraction spectrum was mainly the (0002) peak. The optical gap was 3.5 eV, and the extinction coefficient at 400 nm was 5,000 $cm^{-1}$. Thus, it was completely transparent.

When an ultraviolet ray of 325 nm irradiated from a He—Cd laser, the photoelectric current (Isc) at 0V was 4 $mA/cm^2$. The open voltage (Vo) was 1.2 V.

When the solar cell was accumulated on a TFT liquid crystal display device, there was no harmful influence on the view property. By accumulating a colored plate, an arbitrarily colored solar cell could be obtained.

EXAMPLE 2

A transparent conductive substrate comprising Corning 7059 glass having on the surface thereof ITO formed by a sputtering method was placed on the substrate holder 3, and after evacuating the interior of the reactor 1 to vacuum through the exhaust tube 2, the substrate was heated to 300° C. by the heater 4. An $N_2$ gas was introduced into the quartz tube 5 having a diameter of 25 mm at a rate of 1,000 sccm through the gas inlet tube 9 of the first raw material activator/supplier 13, and discharge was conducted with the microwave waveguide 8 by setting the microwave output of 2.45 GHz to 250 W, which was matched with a tuner. At this time, the reflected wave was 0 W. An $H_2$ gas was introduced into the quartz tube 6 having a diameter of 30 mm at a rate of 1,000 sccm through the gas inlet tube 10 of the second raw material activator/supplier 14, and high frequency discharge of 13.56 MHz was conducted. The output power of the high frequency electric power was 100 W, and the reflected wave was 0 W.

Under these conditions, 1 sccm of a vapor of trimethylgallium (TMGa) maintained at 0° C. was introduced through a mass flow controller from the gas inlet tube 11 of the first raw material activator/supplier 13 by using hydrogen as a carrier gas with bubbling. A cycle, in which trimethylgallium (TMGa) was introduced for 5 seconds and then terminated for 5 seconds, was repeated. Silane was then introduced with hydrogen as a carrier gas in 2 sccm. The silane concentration in the gas was 500 ppm. The reaction pressure measured by a Baratron vacuum gage was 0.5 Torr. The film formation was conducted for 30 minutes to produce an n-type GaN:H (Si) film having a thickness of 0.1 $\mu$m.

Trimethylgallim (TMGa) and cyclopentadienyl magnesium using hydrogen as a carrier gas were then further introduced at a rate of 1 sccm to produce an i-type GaN:H (Mg) film having a thickness of 0.1 $\mu$m. Accordingly, a photoconductor layer containing the Group III-V compound semiconductor was accumulated.

An $SnO_2$ film was produced thereon by a sputtering method to provide a transparent conductive electrode.

The hydrogen content of the film formed simultaneously with the GaN film measured by the HFS measurement was 5% by atom or less. The electron beam diffraction spectrum was of a spot pattern, and the X-ray diffraction spectrum was mainly the (0002) peak. The optical gap was 3.5 eV. The extinction coefficient at 400 nm was 4,500 $cm^{-1}$, and the absorbance was 0.09. Thus, it was completely transparent.

When an ultraviolet ray of 325 nm irradiated from a He—Cd laser, the photoelectric current (Isc) at 0 V was 7 mA/$cm^2$. The open voltage (Vo) was 1.4 V. When the solar cell was accumulated on a TFT liquid crystal display device, there was no harmful influence on the view property. By accumulating a colored plate, an arbitrarily colored solar cell could be obtained.

EXAMPLE 3

A transparent conductive substrate comprising Corning 7059 glass having on the surface thereof ITO formed by a sputtering method was placed on the substrate holder 3, and after evacuating the interior of the reactor 1 to vacuum through the exhaust tube 2, the substrate was heated to 300° C. by the heater 4. An $N_2$ gas was introduced into the quartz tube 5 having a diameter of 25 mm at a rate of 1,000 sccm through the gas inlet tube 9 of the first raw material activator/supplier 13, and discharge was conducted with the microwave waveguide 8 by setting the microwave output of 2.45 to 250 W, which was matched with a tuner. At this time, the reflected wave was 0 W. An $H_2$ gas was introduced into the quartz tube 6 having a diameter of 30 mm at a rate of 1,000 sccm through the gas inlet tube 10 of the second raw material activator/supplier 14, and high frequency discharge of 13.56 MHz was conducted. The output power of the high frequency electric power was 100 W, and the reflected wave was 0 W.

Under these conditions, 1 sccm of a vapor of trimethylgallium (TMGa) maintained at 0° C. was introduced through a mass flow controller from the gas inlet tube 11 of the first raw material activator/supplier 13 by using hydrogen as a carrier gas with bubbling. A cycle, in which trimethylgallium (TMGa) was introduced for 7 seconds and then terminated for 7 seconds, was repeated. Silane was then introduced with hydrogen as a carrier gas in 2 sccm. The film formation was conducted for 60 minutes to produce an n-type GaN:H (Si) film having a thickness of 0.1 $\mu$m.

Cyclopentadienyl magnesium using hydrogen as a carrier gas was then introduced at a rate of 1 sccm to produce an i-type GaN:H (Mg) film having a thickness of 0.05 $\mu$m. Furthermore, cyclopentadienyl magnesium using hydrogen as a carrier gas was further introduced at a rate of 4 sccm to produce a p-type GaN:H (Mg) film having a thickness of 0.1 $\mu$m. Accordingly, a photoconductor layer containing the Group III-V compound semiconductor was accumulated.

An $SnO_2$ film was produced thereon by a sputtering method to provide a transparent conductive electrode.

The optical gap of the accumulated layer was 3.5 eV. The extinction coefficient at 400 nm was 5,200 $cm^{-1}$, and the absorbance was 0.1. Thus, it was completely transparent.

When an ultraviolet ray of 325 nm irradiated from a He—Cd laser, the photoelectric current (Isc) at 0V was 15 mA/$cm^2$. The open voltage (Vo) was 1.5 V from the I-V characteristics. When the solar cell was accumulated on a TFT liquid crystal display device, there was no harmful influence on the view property. By accumulating a colored plate, an arbitrarily colored solar cell could be obtained.

EXAMPLE 4

A transparent electrode comprising ITO having a thickness of 2,000 Å was formed on the surface of Corning 7059 glass by a magnetron sputtering apparatus, to produce a transparent conductive substrate. A photoconductor layer containing titanium oxide (metallic oxide semiconductor) having a thickness of 1,500 Å was formed on the substrate by a magnetron sputtering method. The conditions at this time were a substrate temperature of 300° C., an rf output power of 300 W, an Ar gas flow rate of 100 sccm, and a pressure of 0.1 Torr. It was found from the X-ray diffraction spectrum that titanium oxide in the photoconductor layer was of polycrystals having a rutile structure, and the layer was transparent.

An $SnO_2$ film was produced thereon by a sputtering method to provide a circular transparent conductive electrode having a diameter of 3 mm. The resulting solar cell was transparent. Terminals were withdrawn from the two transparent electrodes, and the voltage-electric current characteristics were measured with HP-4140B. The electric current measured in a dark place was $3 \times 10^{-6}$ A at 0V.

The optical gap was 3.1 eV. The extinction coefficient at 400 nm was 5,000 $cm^{-1}$, and the absorbance was 0.075. Thus, it was completely transparent.

When an ultraviolet ray of 325 nm irradiated from a He—Cd laser, the photoelectric current (Isc) at 0V was 40 mA/$cm^2$. When the solar cell was accumulated on a TFT liquid crystal display device, there was no harmful influence on the view property. By accumulating a colored plate, an arbitrarily colored solar cell could be obtained.

EXAMPLE 5

A transparent electrode comprising ITO having a thickness of 2,000 Å was formed on the surface of Corning 7059 glass by a magnetron sputtering apparatus, to produce a transparent conductive substrate. 1 part by weight of tetraisopropoxytitanium was dissolved in a mixed solvent comprising 50 parts by weight of ethyl alcohol and 50 parts by weight of isopropyl alcohol, and stirred for 2 hours, to obtain a solution. The solution was coated on the transparent conductive substrate by a spin coating method. The coating was repeated 10 times, and after air-drying, heat crystallization was conducted at 400° C. to form a photoconductor layer containing titanium oxide (metallic oxide semiconductor). It was found from the X-ray diffraction spectrum that titanium oxide in the photoconductor layer was of polycrystals, and the layer was transparent.

An $SnO_2$ film was produced thereon by a sputtering method to provide a circular transparent conductive electrode having a diameter of 3 mm. The resulting solar cell was transparent. Terminals were withdrawn from the two transparent electrodes, and the voltage-electric current characteristics were measured with HP-4140B. The electric current measured in a dark place was $1 \times 10^{-6}$ A at 0V.

The optical gap was 3.0 eV. The extinction coefficient at 400 nm was 6,000 $cm^{-1}$, and the absorbance was 0.18. Thus, it was completely transparent.

When an ultraviolet ray of 325 nm irradiated from a He—Cd laser, the photoelectric current (Isc) at 0V was 25 $mA/cm^2$. When the solar cell was accumulated on a TFT liquid crystal display device, there was no harmful influence on the view property. By accumulating a colored plate, an arbitrarily colored solar cell could be obtained.

EXAMPLE 6

A photoconductor layer containing titanium oxide was formed on a transparent conductive substrate in the same manner as Example 4, and the substrate was placed on the substrate holder 3. After evacuating the interior of the reactor 1 to vacuum through the exhaust tube 2, the substrate was heated to 300° C. by the heater 4. An $N_2$ gas was introduced into the quartz tube 5 having a diameter of 25 mm at a rate of 1,000 sccm through the gas inlet tube 9 of the first raw material activator/supplier 13, and discharge was conducted with the microwave waveguide 8 by setting the microwave output of 2.45 GHz to 250 W, which was matched with a tuner. At this time, the reflected wave was 0 W. An $H_2$ gas was introduced into the quartz tube 6 having a diameter of 30 mm at a rate of 1,000 sccm through the gas inlet tube 10 of the second raw material activator/supplier 14, and high frequency discharge of 13.56 MHz was conducted. The output power of the high frequency electric power was 100 W, and the reflected wave was 0 W.

Under these conditions, 1 sccm of a vapor of trimethylgallium (TMGa) maintained at 0° C. was introduced through a mass flow controller from the gas inlet tube 11 of the first raw material activator/supplier 13 by using hydrogen as a carrier gas with bubbling. Cyclopentadienyl magnesium using hydrogen as a carrier gas was further introduced at a rate of 1 sccm. The reaction pressure measured by a Baratron vacuum gage was 0.5 Torr. The film formation was conducted for 60 minutes to produce an i-type GaN:H film having a thickness of 0.2 $\mu$m. Accordingly, a photoconductor layer containing the Group III-V compound semiconductor was formed on the photoconductor layer containing titanium oxide (metallic oxide semiconductor).

An $Sno_2$ film was produced thereon by a sputtering method to provide a transparent conductive electrode.

The optical gap was 3.1 eV. The extinction coefficient at 400 nm was 7,000 $cm^{-1}$, and the absorbance was 0.2. Thus, it was completely transparent.

When an ultraviolet ray of 325 nm irradiated from a He—Cd laser, the photoelectric current (Isc) at 0V was 7 $mA/cm^2$. The open voltage (Vo) was 1.4 V. When the solar cell was accumulated on a TFT liquid crystal display device, there was no harmful influence on the view property. By accumulating a colored plate, an arbitrarily colored solar cell could be obtained.

According to the invention, an essentially transparent solar cell of high efficiency can be obtained that can generate electricity with utilizing a harmful and useless ultraviolet ray, that can be used by accumulating with a display device to generate electricity simultaneously with utilization of the display function, and that exhibits less feeling of existence. According to the invention, a self-power-supply display device comprising the solar cell can also be obtained. Furthermore, the invention provides a process for producing the solar cell.

What is claimed is:

1. A solar cell comprising a transparent conductive substrate having thereon a photoconductor layer that is transparent to a visible ray and has an absorbance of 0.8 or less at a wavelength of from 400 to 800 nm, and a transparent conductive electrode in this order.

2. A solar cell as claimed in claim 1, wherein said photoconductor layer contains at least one element selected from Group IIIA elements and at least one element selected from Group VA elements in the Periodic Table.

3. A solar cell as claimed in claim 1, wherein said photoconductor layer contains a metallic oxide semiconductor.

4. A solar cell as claimed in claim 3, wherein said metallic oxide semiconductor contains at least one of titanium oxide and zinc oxide.

5. A solar cell as claimed in claim 1, wherein said photoconductor layer has a laminated structure.

6. A solar cell as claimed in claim 5, wherein said laminated structure comprises a first photoconductor layer containing at least one element selected from Group IIIA elements and at least one element selected from Group VA elements in the Periodic Table, and a second photoconductor layer containing a metallic oxide semiconductor.

7. A solar cell as claimed in claim 1, wherein said photoconductor layer has an optical gap of 2.8 eV or more.

8. A solar cell as claimed in claim 1, wherein said solar cell has a photoelectric conversion efficiency for light of an ultraviolet region that is larger than a photoelectric conversion efficiency for light of a visible region.

9. A self-power-supply display device comprising a solar cell as claimed in claim 1, and a display device accumulated thereon.

10. The solar cell according to claim 1, wherein the transparent conductive electrode is essentially transparent.

11. The solar cell according to claim 1, wherein the transparent conductive electrode consists of a transparent film of conductive material.

12. The solar cell according to claim 1, wherein the transparent conductive electrode is completely transparent.

13. A process for producing a solar cell comprising a step of providing a photoconductor layer on a transparent conductive substrate by activating a compound containing a nitrogen element to an activated species, and reacting said activated species with an organic metallic compound containing at least one element selected from Al, Ga and In; and a step of providing a transparent conductive electrode on said photoconductor layer.

14. A process for producing a solar cell as claimed in claim 13, wherein said reacting is under an atmosphere containing hydrogen.

* * * * *